US011319153B2

(12) United States Patent
Maeda

(10) Patent No.: US 11,319,153 B2
(45) Date of Patent: May 3, 2022

(54) FLOOR-TO-FLOOR TRANSPORT SYSTEM AND FLOOR-TO-FLOOR TRANSPORT METHOD

(71) Applicant: MURATA MACHINERY, LTD., Kyoto (JP)

(72) Inventor: Toshihiro Maeda, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 233 days.

(21) Appl. No.: 16/619,134

(22) PCT Filed: May 7, 2018

(86) PCT No.: PCT/JP2018/017621
§ 371 (c)(1),
(2) Date: Dec. 4, 2019

(87) PCT Pub. No.: WO2018/225435
PCT Pub. Date: Dec. 13, 2018

(65) Prior Publication Data
US 2020/0115160 A1    Apr. 16, 2020

(30) Foreign Application Priority Data

Jun. 6, 2017 (JP) .............................. JP2017-111474

(51) Int. Cl.
*G06F 7/00*      (2006.01)
*B65G 1/137*     (2006.01)
(Continued)

(52) U.S. Cl.
CPC ........... *B65G 1/1375* (2013.01); *B65G 47/57* (2013.01); *B66B 9/10* (2013.01)

(58) Field of Classification Search
CPC .... B65G 1/1375; B65G 47/57; B65G 1/0457; B65G 2201/0297; B66B 9/10;
(Continued)

(56) References Cited

U.S. PATENT DOCUMENTS

2003/0235486 A1  12/2003 Doherty et al.
2009/0107803 A1   4/2009 Ellerth et al.
(Continued)

FOREIGN PATENT DOCUMENTS

JP    58-135010 A    8/1983
JP    2006-111421 A  4/2006
(Continued)

OTHER PUBLICATIONS

Official Communication issued in corresponding European Patent Application No. 18813879.6, mailed on Apr. 22, 2021.
(Continued)

*Primary Examiner* — Yolanda R Cumbess
(74) *Attorney, Agent, or Firm* — Keating & Bennett, LLP

(57) ABSTRACT

A floor-to-floor transport system that transports an article between different floors by using an upward path and a downward path in a vertical transporter that revolves in one direction includes, on at least one floor: a loading transport line that transports to the vertical transporter an article to be transported to another floor; a first loading opening through which the article is loaded into the upward path in the vertical transporter; a second loading opening through which the article is loaded into the downward path in the vertical transporter; a transferor that selectively transfers to the first loading opening or the second loading opening an article transported by the loading transport line; and a controller that controls the transferor depending on a destination of the article.

11 Claims, 12 Drawing Sheets

(51) Int. Cl.
*B65G 47/57* (2006.01)
*B66B 9/10* (2006.01)

(58) Field of Classification Search
CPC ......... H01L 21/67706; H01L 21/67715; H01L 21/67727; H01L 21/67736; H01L 21/6773; H01L 21/67751; H01L 21/67259; H01L 21/67733
USPC .................................................. 700/213, 218
See application file for complete search history.

(56) References Cited

U.S. PATENT DOCUMENTS

| | | |
|---|---|---|
| 2011/0106300 A1 | 5/2011 | Wang et al. |
| 2015/0162228 A1 | 6/2015 | Wang et al. |
| 2016/0251170 A1 | 9/2016 | Pedrazzini |

FOREIGN PATENT DOCUMENTS

| | | | |
|---|---|---|---|
| JP | 2010-013250 A | | 1/2010 |
| JP | 2010013250 A | * | 1/2010 |
| JP | 2016-204154 A | | 12/2016 |

OTHER PUBLICATIONS

Official Communication issued in International Patent Application No. PCT/JP2018/017621, mailed on Jul. 31, 2018.
Official Communication issued in corresponding Euroepan Patent Application No. 18813879.6, dated Feb. 12, 2021.
Official Communication issued in corresponding Taiwanese Patent Application No. 107118308, dated Oct. 14, 2021.

\* cited by examiner

FLOOR-TO-FLOOR TRANSPORT SYSTEM AND FLOOR-TO-FLOOR TRANSPORT METHOD

BACKGROUND OF THE INVENTION

1. Field of the Invention

The present invention relates to a floor-to-floor transport system and a floor-to-floor transport method.

2. Description of the Related Art

In some manufacturing factories such as semiconductor manufacturing factories, a production facility is arranged on each of a plurality of floors in a building. In such a production facility, for example, an article such as a transport container (FOUP) having a semiconductor wafer to be treated housed therein is transported from the current floor to another floor. Floor-to-floor transport systems that execute such transport have been known (see, for example, Japanese Unexamined Patent Application Publication No. 2006-111421). In particular, when an article is transported from the outside of a building, such as another building, to each floor through a particular floor, a floor-to-floor transport system is necessary in order to transport the article from a floor through which the article has been carried in the building to another floor.

The floor-to-floor transport system disclosed in Japanese Unexamined Patent Application Publication No. 2006-111421 includes a vertical transporter that is installed over a plurality of floors and transports an article in the vertical direction, and a conveyor that carries or discharges the article into or from the vertical transporter. In the floor-to-floor transport system, an article that has been conveyed by the conveyor is transported to another floor as a transport destination by the vertical transporter, and transports an article that has been transported from another floor by the vertical transporter to a desired location in a floor by the conveyor.

The vertical transporter in the above-mentioned floor-to-floor transport system is operated so as to circulate an article in one of upward and downward directions and transport the article between different floors by using an upward path and a downward path. In this operation, an article loading opening is provided in the upward path for each floor, and an article unloading opening is provided in the downward path. Thus, in the case of transporting an article to another floor, circulating transport in which an article loaded to the vertical transporter is transported to the highest place in the upward path in the vertical transporter and is then directed toward another floor in the downward path is necessary, and hence it takes time to transport an article between floors. In particular, in the case of transporting an article to a floor lower than the current floor, long circulating transport in which the article is turned at the highest location and transported and is then directed to a lower floor after passing through the current floor in the downward path is necessary, and hence there is a problem in that it takes a long time to transport an article between floors.

SUMMARY OF THE INVENTION

Preferred embodiments of the present invention provide floor-to-floor transport systems and floor-to-floor transport methods capable of reducing a time required for transporting an article from the current floor to another floor.

A floor-to-floor transport system according to a preferred embodiment of the present invention that transports an article between different floors by using an upward path and a downward path in a vertical transporter that revolves in one direction includes, on at least one floor: a loading transport line that transports to the vertical transporter an article to be transported to another floor; a first loading opening through which the article is loaded into the upward path in the vertical transporter; a second loading opening through which the article is loaded into the downward path in the vertical transporter; a transferor that selectively transfers to the first loading opening or the second loading opening an article transported by the loading transport line; and a controller that controls the transferor depending on a destination of the article.

The loading transport line may be connected to one of the first loading opening and the second loading opening, and include: a first loading port that transfers to the transferor an article to be transported to another of the first loading opening and the second loading opening; a second loading port on which an article transferred from the first loading port by the transferor is placed; and a loading connection line that transports to the other of the first loading opening and the second loading opening an article from the second loading port. One or both of the first loading port and the second loading port may be provided in plurality, and the transferor may be capable of moving between a plurality of the first loading ports or between a plurality of the second loading ports. One or both of the first loading port and the second loading port may be provided in plurality, and the transferor may be disposed for each of a plurality of the first loading ports or each of a plurality of the second loading ports.

A floor-to-floor transport system according to a preferred embodiment of the present invention that transports an article between different floors by using an upward path and a downward path in a vertical transporter that revolves in one direction includes, on at least one floor: a discharge transport line that transports an article that has been transported from another floor and been unloaded from the vertical transporter; a first unloading opening through which an article is unloaded from the downward path in the vertical transporter; a second unloading opening through which an article is unloaded from the upward path in the vertical transporter; a transferor that transfers to the discharge transport line the article unloaded through the first unloading opening or the second unloading opening; and a controller that controls the transferor.

The discharge transport line may be connected to one of the first unloading opening and the second unloading opening, and include: a discharge connection line that transports an article that has been unloaded through the first unloading opening or the second unloading opening; a first discharge port that transfers to the transferor an article that has been transported by the discharge connection line; and a second discharge port on which an article transferred from the first discharge port by the transferor is placed, and sends the article to the discharge transport line. One or both of the first discharge port and the second discharge port may be provided in plurality, and the transferor may be capable of moving between a plurality of the first discharge ports or between a plurality of the second discharge ports. One or both of the first discharge port and the second discharge port may be provided in plurality, and the transferor may be disposed for each of a plurality of the first discharge ports or each of a plurality of the second discharge ports.

A floor-to-floor transport system according to a preferred embodiment of the present invention that transports an article between different floors by using an upward path and a downward path in a vertical transporter that revolves in one direction includes, on at least one floor: a loading transport line that transports to the vertical transporter an article to be transported to another floor; a first loading opening through which the article is loaded into the upward path in the vertical transporter; a second loading opening through which the article is loaded into the downward path in the vertical transporter; a discharge transport line that transports an article that has been transported from another floor and been unloaded from the vertical transporter; a first unloading opening through which an article is unloaded from the downward path in the vertical transporter; a second unloading opening through which an article is unloaded from the upward path in the vertical transporter; a transferor that selectively transfers to the first loading opening or the second loading opening an article transported by the loading transport line and transfers to the discharge transport line an article unloaded through the first unloading opening or the second unloading opening; and a controller that controls the transferor.

The transferor may be an overhead transport vehicle that moves along a rail installed on a ceiling or near a ceiling and include a transferor capable of transferring an article.

A floor-to-floor transport method according to a preferred embodiment of the present invention to transport an article between different floors by using an upward path and a downward path in a vertical transporter that revolves in one direction includes: acquiring, on at least one floor, a transport destination of an article that has been transported; and determining, when transporting the article to another floor, based on the acquired transport destination, whether to load the article into a first loading opening provided in the upward path in the vertical transporter or load the article into a second loading opening provided in the downward path in the vertical transporter.

In the floor-to-floor transport systems and the floor-to-floor transport methods according to preferred embodiments of the present invention, an article to be transported to an upper floor is loaded into the first loading opening in the upward path in the vertical transporter, and an article to be transported to a lower floor is loaded into the second loading opening in the downward path in the vertical transporter. Consequently, an article can be loaded to the first loading opening when the article is transported to an upper floor such that the article can be transported in a short period of time, and hence circulating transport in which the article turns in the upper portion of the vertical transporter can be avoided to reduce the transport time of the article to suppress the reduction in production efficiency.

In the case where the loading transport line is connected to one of the first loading opening and the second loading opening and includes: the first loading port that transfers to the transferor an article to be transported to another of the first loading opening and the second loading opening; the second loading port on which an article transferred from the first loading port by the transferor is placed; and the loading connection line that transports to the other of the first loading opening and the second loading opening an article from the second loading port, an article can be efficiently loaded into the first loading opening or the second loading opening from the loading connection line by the transferor. In the case where one or both of the first loading port and the second loading port are provided in plurality and the transferor is capable of moving between a plurality of the first loading ports or between a plurality of the second loading ports, the transferor can move between the first loading ports, and hence an article can be transferred by a smaller number of movers than the number of the first loading ports, and facility cost can be reduced. In the case where one or both of the first loading port and the second loading port are provided in plurality and the transferor is provided for each of a plurality of the first loading ports or each of a plurality of the second loading ports, an article can be transferred from the first loading port to the second loading port by using the transferors, and hence the loading efficiency of articles can be improved.

In a floor-to-floor transport system according to a preferred embodiment of the present invention, the first unloading opening and the second unloading opening are provided for each of the downward path and the upward path in the vertical transporter. When an article has been transported from an upper floor, the article is unloaded through the first unloading opening in the downward path on a lower floor, and when an article has been transported from a lower floor, the article is unloaded through the second unloading opening in the upward path on an upper floor. Consequently, circulating transport in which the article turns in the lower or upper portion of the vertical transporter can be avoided to reduce the transport time of the article to suppress the reduction in production efficiency.

In the case where the discharge transport line is connected to one of the first unloading opening and the second unloading opening and includes: the discharge connection line that transfers an article that has been unloaded through another of the first unloading opening and the second unloading opening; the first discharge port that transfers to the transferor an article that has been transported by the discharge connection line; and the second discharge port on which an article transferred from the first discharge port by the transferor is placed, and that sends the article to the discharge transport line, an article can be smoothly discharged to the discharge transport line from the first unloading opening or the second unloading opening by the transferor. In the case where one or both of the first discharge port and the second discharge port are provided in plurality and the transferor is capable of moving between a plurality of the first discharge ports or between a plurality of the second discharge ports, the transferor can move between the first discharge ports, and hence an article can be transferred by a smaller number of movers than the number of the first discharge ports, and facility cost can be reduced. In the case where one or both of the first discharge port and the second discharge port are provided in plurality and the transferor is provided for each of a plurality of the first discharge ports or each of a plurality of the second discharge ports, an article can be transferred from the first discharge port to the second discharge port by using the transferors, and hence the discharging efficiency of the article can be improved.

In a floor-to-floor transport system according to a preferred embodiment of the present invention, an article that has been loaded through the first loading opening and transported by the upward path is unloaded through the second unloading opening in the upward path on an upper floor, and an article that has been loaded through the second loading opening and transported by the downward path is unloaded through the first unloading opening in the downward path on a lower floor. Consequently, the article can be transported in the shortest route while avoiding the circulating transport, and hence the transport time of the article can be reduced to suppress the reduction in production efficiency.

In the case where the transferor is an overhead transport vehicle that moves along a rail installed on a ceiling or near a ceiling and includes a transfer mechanism capable of transferring an article, an additional transferor is not required to be provided because the transfer mechanism in the overhead transport vehicle is used, and facility cost can be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
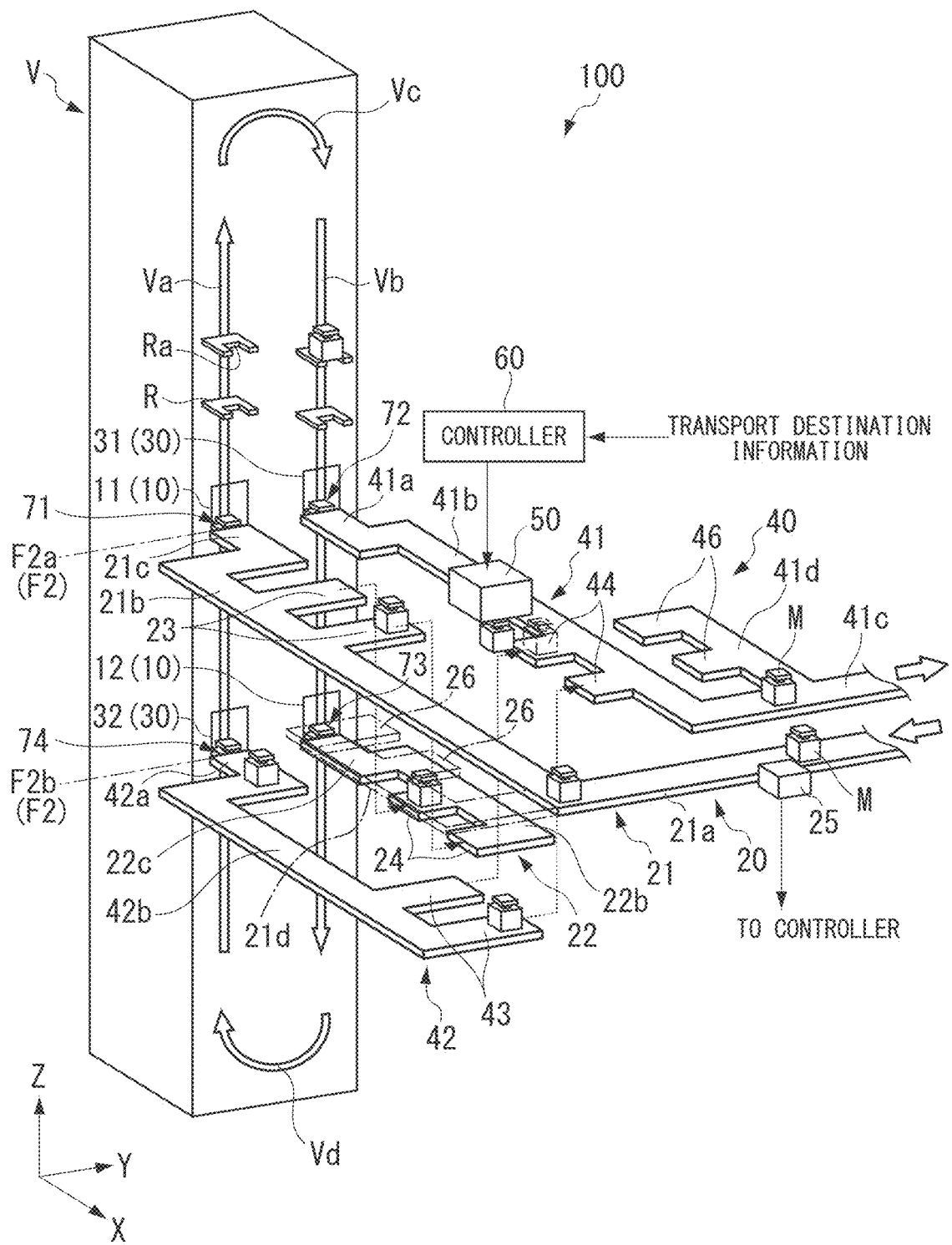
FIG. 1 is a perspective view illustrating an example of a floor-to-floor transport system according to a preferred embodiment of the present invention.

Preferred embodiments of the present invention are described with reference to the drawings. The present invention is not limited to the configurations described below. In the drawings, some parts are enlarged or emphasized with scales appropriately changed for the description of the preferred embodiment. In each figure referred to below, directions in the figure are described by using an XYZ coordinate system. In the XYZ coordinate system, a plane parallel to the horizontal plane is an XY plane. A direction perpendicular to the XY plane is referred to as "Z direction". Regarding the X direction, the Y direction, and the Z direction, directions in the arrows in the figures are + directions, and directions opposite to the directions in the arrows are − directions.

Figure 2:
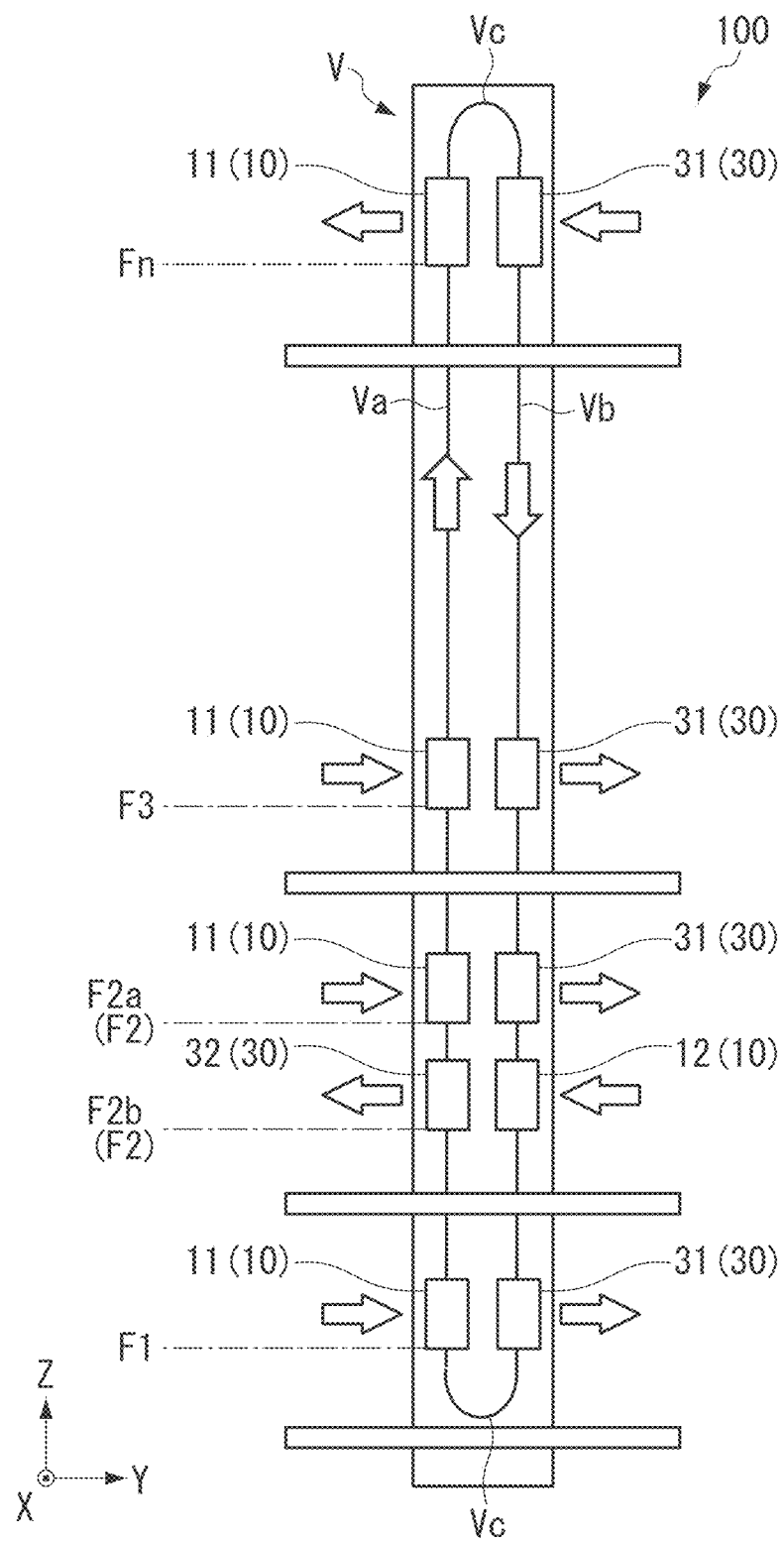
FIG. 2 is a diagram schematically illustrating an example of a vertical transporter.

FIG. 1 is a perspective view illustrating an example of a floor-to-floor transport system 100 according to a preferred embodiment of the present invention. FIG. 2 is a diagram schematically illustrating a vertical transporter V included in the floor-to-floor transport system 100. For example, in a production facility such as a semiconductor manufacturing factory where a production line is arranged on each of a plurality of floors in a building, the floor-to-floor transport system 100 transports an article M to be treated from the current floor to another floor. The article M is transported by the floor-to-floor transport system 100 from the outside of a building, such as another building, to a particular floor, and is transported from the particular floor to another floor as needed.

For example, the article M is a FOUP, a SMIF Pod, or a reticle Pod that can be purged inside, and contains a wafer or a reticle used to manufacture a semiconductor element. The present preferred embodiment is an example where the article M is a FOUP. Each article M includes a tag, a barcode, or a two-dimensional code indicating a transport destination or an RFID capable of transmitting information on the transport destination. The floor-to-floor transport system 100 in the present preferred embodiment reads or receives information on a transport destination of each article M and transports each article M to a floor at the transport destination based on the information on the transport destination.

As illustrated in FIG. 1 and FIG. 2, when an article M is transported from the outside of a building, such as another building, to a particular floor, the floor-to-floor transport system 100 uses an upward path Va and a downward path Vb in the vertical transporter V that revolves in one direction to transport the article M to a different floor. Also, in the case of transporting an article M from the current floor to another floor in a building, the floor-to-floor transport system 100 uses the upward path Va and the downward path Vb in the vertical transporter V to transport the article M. The upward path Va in the vertical transporter V moves an article M upward (+Z direction) in the vertical direction while placing the article M thereon. The downward path Vb moves an article M downward (−Z direction) in the vertical direction while placing the article M thereon. The upward path Va and the downward path Vb are connected by an upper circulating path Vc and a lower circulating path Vd.

The vertical transporter V includes a plurality of racks R that place articles M thereon, and a driver (not shown) that circulates the racks R in one direction along the upward path Va, the upper circulating path Vc, the downward path Vb, and the lower circulating path Vd. Each rack R has a notch Ra having dimensions and shape that allow portions of loaders 71 and 73 and unloaders 72 and 74 (see article supports 71d, 72d, 73d, and 74d in FIGS. 6A to 8C) described later to pass therethrough.

The floor-to-floor transport system 100 includes loading openings 10, a loading transport line 20, unloading openings 30, a discharge transport line 40, a transferor 50, and a controller 60. The floor-to-floor transport system 100 is disposed on at least one floor in a building. In the present preferred embodiment, the case where the floor-to-floor transport system 100 is disposed at the second floor F2 in a building is described as an example, but the present preferred embodiment is not limited to this configuration, and the floor-to-floor transport system 100 may be disposed at another floor. The floor-to-floor transport system 100 may be disposed at each of a plurality of floors.

Figure 3:
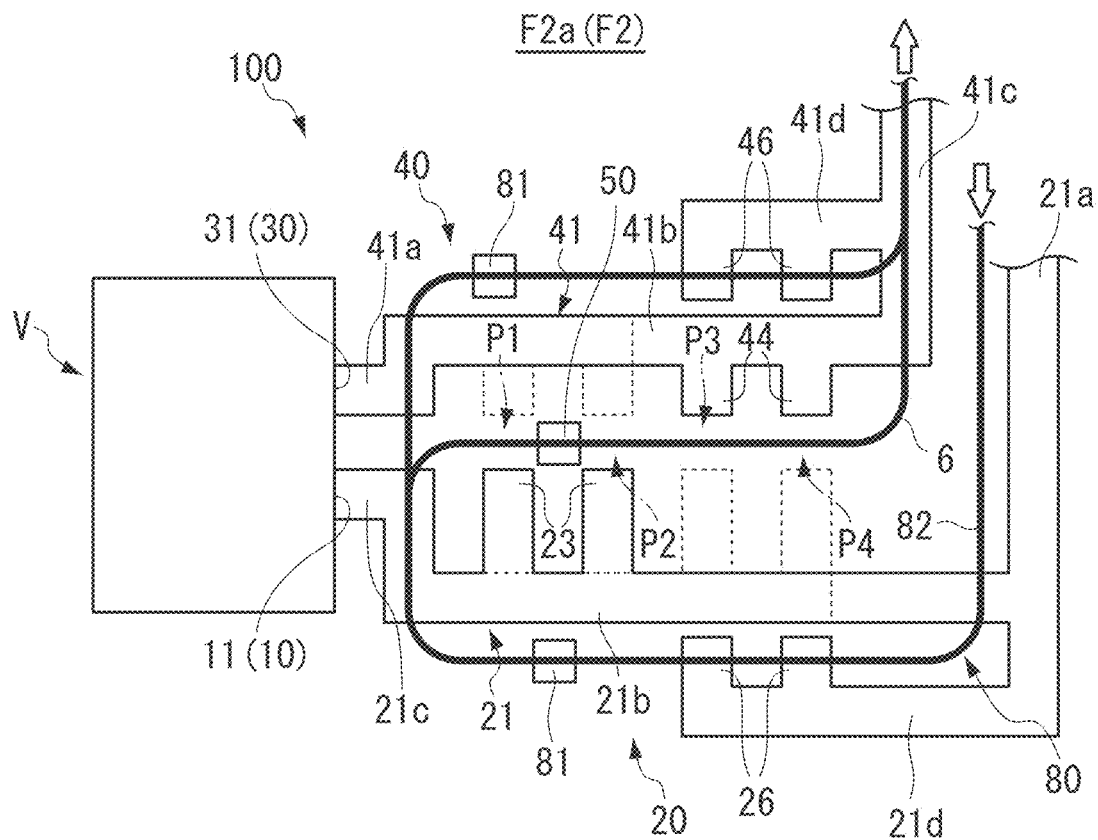
FIG. 3 is a plan view of the floor-to-floor transport system illustrated in FIG. 1 as seen from the above.
Figure 3:
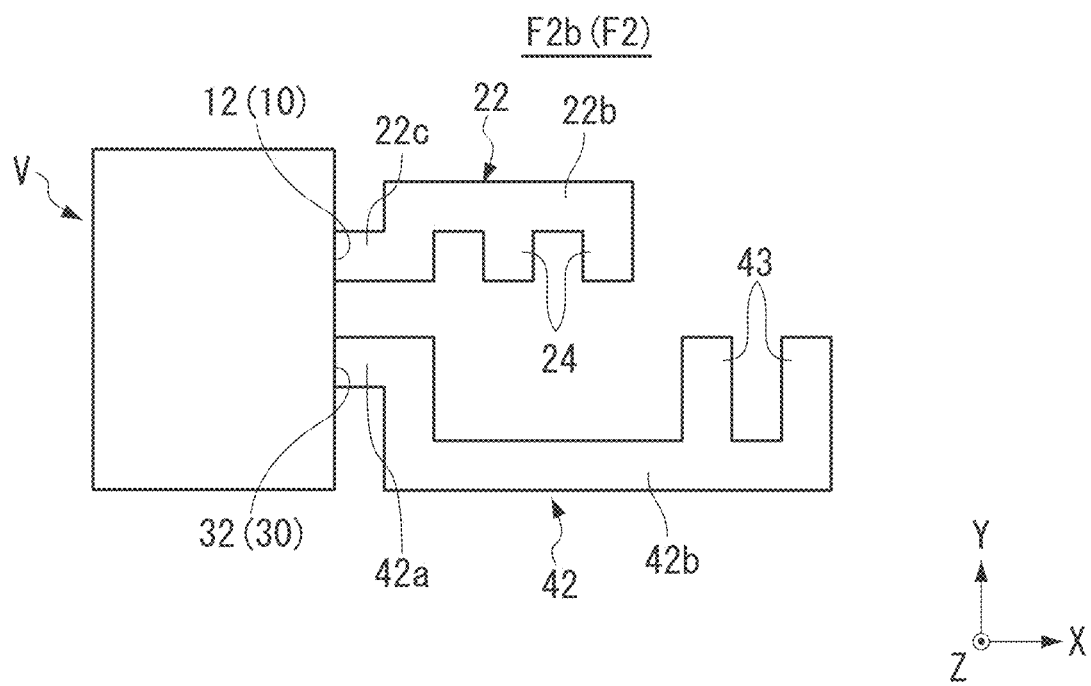

FIG. 3 is a plan view of an example of the floor-to-floor transport system 100 disposed at the second floor F2 as seen from the above. In FIG. 3, the second floor F2 is illustrated with separate configurations of the upper place F2a and the lower place F2b.

As illustrated in FIG. 1 to FIG. 3, each of the loading openings 10 is a portion through which an article is loaded into the vertical transporter V. The loading opening 10 includes a first loading opening 11 and a second loading opening 12. The first loading opening 11 is used to load an article M into the upward path Va in the vertical transporter V. The first loading opening 11 is disposed at each floor (first floor F1, second floor F2, third floor F3 to n-th floor Fn: see FIG. 2). The first loading opening 11 is disposed at an upper place F2a on the second floor F2. In the first loading opening 11, the loader 71 described later is disposed. The loader 71 receives an article M from the loading transport line 20, and places the article M onto a rack R in the vertical transporter V. The second loading opening 12 is used to load an article M into the downward path Vb in the vertical transporter V. The second loading opening 12 is disposed at a lower place F2b of the second floor F2. In the second 12, the loader 73 described later is disposed.

The loading transport line 20 includes a loading main line 21, a loading connection line 22, a first loading port 23, and a second loading port 24. The loading main line 21 is connected to one of the first loading opening 11 and the second loading opening 12. In the present preferred embodiment, the case where the loading main line 21 is connected to the first loading opening 11 is described as an example. The loading main line 21 transports an article M transported from the outside of a building to the first loading opening 11. The loading main line 21 is disposed at the upper place F2a on the second floor F2 and includes a transporter such as a roller conveyor and a belt conveyor. The loading main line 21 has an external connector 21a extending in a -Y direction from the outside, a linear transporter 21b extending in the -X direction from the external connector 21a toward the vertical transporter V, and a loading transporter 21c that transports the article M from the linear transporter 21b toward the first loading opening 11. The loading main line 21 includes a floor transporter 21d to transport an article M within the same floor (second floor F2) in this building. The floor transporter 21d extends in the -X direction from a -Y side end of the external connector 21a.

The loading transport line 20 includes a detector 25 that detects a transport destination of an article M transported from the outside. The detector 25 reads an identification ID included in the above-mentioned tag provided to the article M to acquire a transport destination of the identification ID from a host controller (not shown) and transmits information on the transport destination of the article M to the controller 60. When the above-mentioned tag includes information on a transport destination of an article M, the detector 25 directly reads the information on the transport destination from the above-mentioned tag and transmits the information to the controller 60.

The loading connection line 22 is connected to the other of the first loading opening 11 and the second loading opening 12 to which the loading main line 21 is connected. In the present preferred embodiment, the case where the loading connection line 22 is connected to the second loading opening 12 is described as an example. The loading connection line 22 is disposed at the lower place F2b of the second floor F2, and, for example, similarly to the loading main line 21, and has a transport mechanism such as a roller conveyor and a belt conveyor. The loading connection line 22 includes a linear transporter 22b extending in the -X direction toward the vertical transporter V, and a loading transporter 22c that transports an article from the linear transporter 22b toward the second loading opening 12.

The first loading port 23 is provided at a position extended from the linear transporter 21b in the loading main line 21 in the +Y direction. The plurality of (for example, two) first loading ports 23 are disposed side by side in the transport direction (X direction) of the article M in the linear transporter 21b. The first loading port 23 is used as a location to place an article M thereon in order to transfer the article M to the transferor 50 described later.

The second loading port 24 is provided at a position extended from the linear transporter 22b in the loading connection line 22 in the -Y direction. The plurality of (for example, two) second loading ports 24 are disposed side by side in the transport direction (X direction) of the article M in the linear transporter 22b. The second loading port 24 is used as a location to place thereon an article M transferred from the transferor 50 described later. As seen from the above, the second loading ports 24 are each disposed so as to be opposed to a position on the +Y side of the first loading port 23 across a movement path of the transferor 50 described later. The numbers of the first loading ports 23 and the second loading ports 24 are the same but may be different. In the floor transporter 21d, a plurality of (for example, two) transport ports 26 are provided side by side in the X direction. The transport ports 26 are provided at a position at which an article M transported from the floor transporter 21d can be placed and be received by overhead transport vehicles 81 described later. In FIG. 1, the floor transporter 21d and the transport ports 26 are illustrated by chain lines.

Each of the unloading openings 30 is used to unload an article M from the vertical transporter V. The unloading opening 30 has a first unloading opening 31 and a second unloading opening 32. The first unloading opening 31 is used to unload an article M from the downward path Vb in the vertical transporter V. The first unloading opening 31 is disposed at each floor (first floor F1, second floor F2, third floor F3, . . . , n-th floor Fn: see FIG. 2). The first unloading opening 31 is disposed at an upper place F2a on the second floor F2.

In the first unloading opening 31, an unloader 72 described later is disposed. The unloader 72 transports an article M placed on a rack R in the vertical transporter V to the discharge transporter 41a. The second unloading opening 32 is used to unload an article M from the upward path Va in the vertical transporter V. The second unloading opening 32 is disposed at a lower place F2b on the second floor F2. In the second unloading opening 32, an unloader 74 described later is disposed. The unloader 74 transports an article M placed on a rack R in the vertical transporter V to the discharge transporter 42a.

The discharge transport line 40 includes a discharge main line 41, a discharge connection line 42, a first discharge port 43, and a second discharge port 44. The discharge main line 41 is connected to one of the first unloading opening 31 and the second unloading opening 32. In the present preferred embodiment, the case where the discharge main line 41 is connected to the first unloading opening 31 is described as an example. The discharge main line 41 transports to the outside of a building an article M unloaded through the first unloading opening 31. The discharge main line 41 is disposed at the upper place F2a on the second floor F2, and includes, for example, a transporter such as a roller conveyor and a belt conveyor. The discharge main line 41 includes a discharge transporter 41a that carries out an article M unloaded through the first unloading opening 31, a linear transporter 41b extending from the discharge transporter 41a in the +X direction, and an external connector 41c extending from the linear transporter 41b in the +Y direction toward the outside of the building. The discharge main line 41 includes a floor transporter 41d to transport an article M within the same floor (second floor F2) in the building. The floor transporter 41d extends in the −X direction from the middle of the external connector 41c.

The discharge connection line 42 is connected to the other of the first 31 and the second unloading opening 32 that is different from the connection destination of the discharge main line 41. In the present preferred embodiment, the case where the discharge connection line 42 is connected to the second unloading opening 32 is described as an example. The discharge connection line 42 is disposed at the lower place F2b on the second floor F2, and has, similarly to the discharge main line 41, for example, a transport mechanism such as a roller conveyor and a belt conveyor. The discharge connection line 42 includes a discharge transporter 42a that carries out an article M unloaded through the second unloading opening 32, and a linear transporter 42b extending in the +X direction from the discharge transporter 42a.

The first discharge port 43 extends in the +Y direction from the linear transporter 42b in the discharge connection line 42. The plurality of (for example, two) first discharge ports 43 are disposed side by side in the transport direction (X direction) of the article M in the linear transporter 42b. The first discharge port 43 is used as a location to place an article M thereon in order to transfer the article M to the transferor 50 described later.

The second discharge port 44 is provided at a position extended from the linear transporter 41b in the discharge main line 41 in the −Y direction. The plurality of (for example, two) second discharge ports 44 are disposed side by side in a direction (X direction) in which the article M is transported by the linear transporter 41b. The second discharge port 44 is used as a location to place thereon an article M transferred from the transferor 50 described later. As seen from the above, the second discharge ports 44 are each disposed so as to be opposed to a position on the +Y side of the first discharge port 43 across a movement path of the transferor 50 described later. The numbers of the first discharge ports 43 and the second discharge ports 44 are the same but may be different. In the floor transporter 41d, a plurality of (for example, two) transport ports 46 are provided side by side in the X direction. The transport ports 46 are provided at a position at which an article M transported from the floor transporter 41d can be placed and be received by the overhead transport vehicles 81 described later.

The discharge transport line 40 may include a detector that detects information on an article M to be transported to the outside of a building. For example, the detector may read information included in the above-mentioned tag provided to the article M and transmit the information on the article M to the controller 60. The controller 60 may transmit information on the article M to a host controller (not shown), or may transmit information on the article M to a transport system in another building as a transport destination of the article M.

Figure 4:
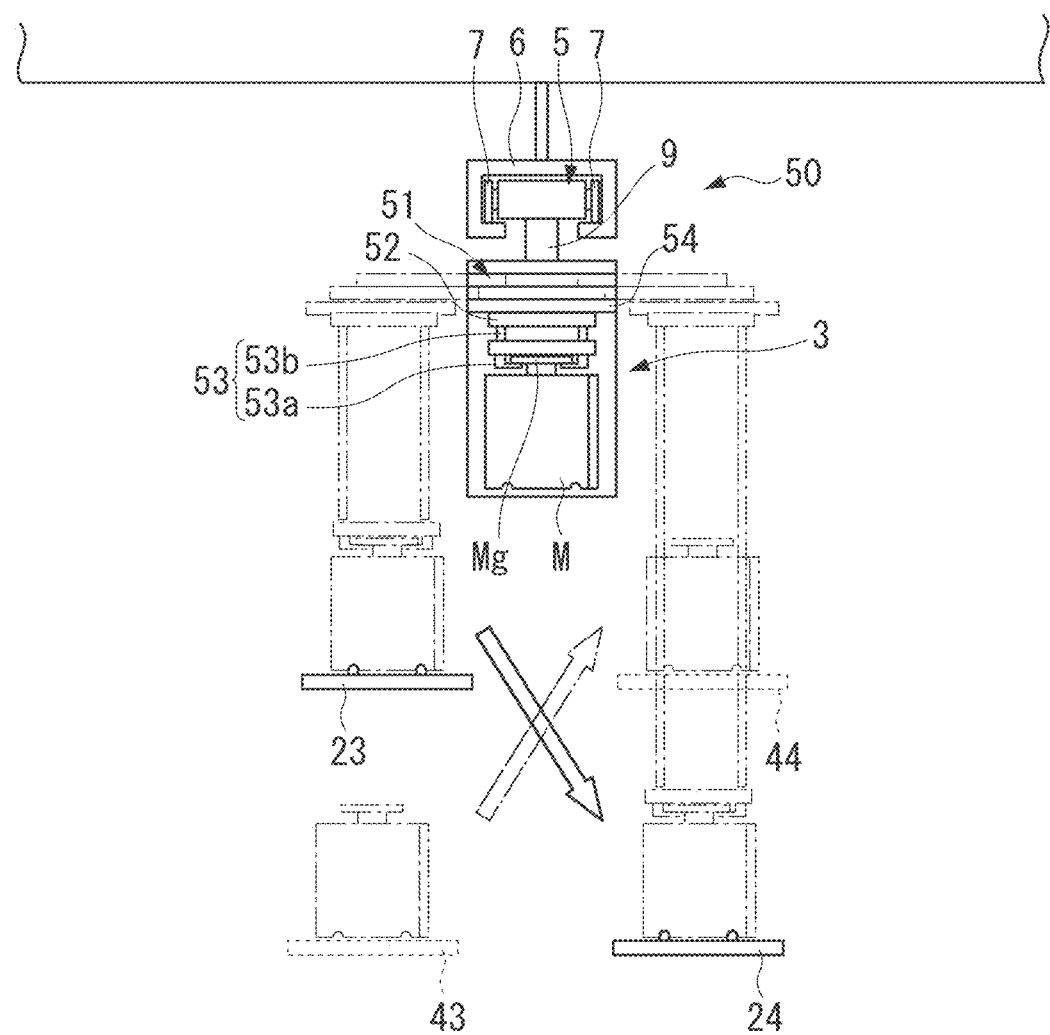
FIG. 4 is a diagram illustrating an example of an overhead transport vehicle as a transferor.
Figure 5:
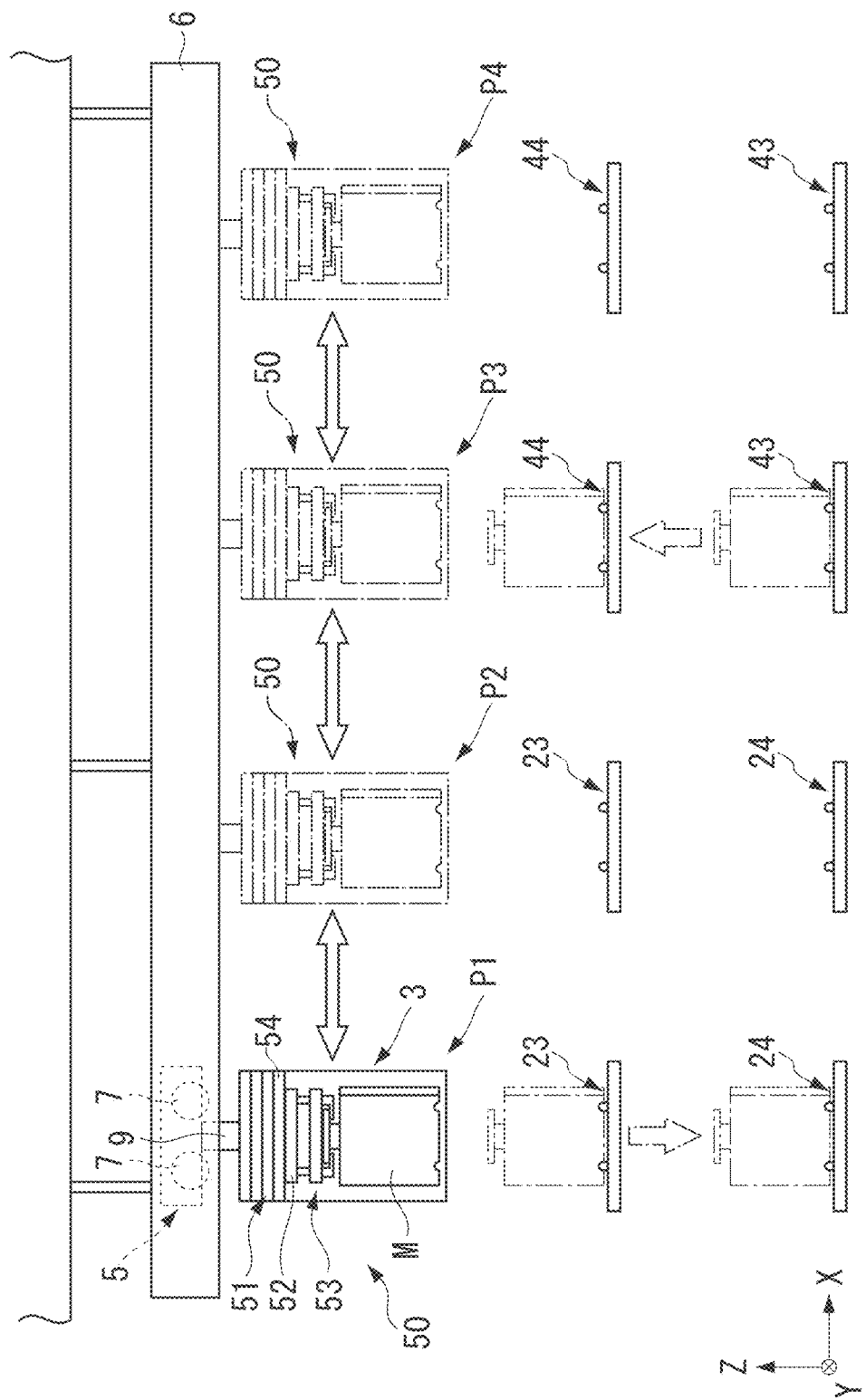
FIG. 5 is a diagram illustrating an example where an article is transferred by the overhead transport vehicle as the transferor.

The transferor 50 selectively transfers to the first loading opening 11 or the second 12 an article M transported by the loading transport line 20. The transferor 50 transfers to the discharge transport line 40 an article M unloaded through the first unloading opening 31 or the second unloading opening 32. FIG. 4 is a diagram illustrating an example of the transferor 50. FIG. 5 is a diagram illustrating an example in which an article M is transferred by the transferor 50. As the transferor 50, an overhead transport vehicle is preferably used.

The transferor (overhead transport vehicle) 50 includes a runner 5 and a transfer mechanism 3. The runner 5 travels along a rail 6 by a driver (not shown). For example, the rail 6 is installed on the ceiling of the second floor F2 or near the ceiling. The rail 6 is disposed to extend in the X direction over a region between the first loading port 23 and the second loading port 24 and over a region between the first discharge port 43 and the second discharge port 44. Thus, the transferor 50 can move between the first loading port 23 and the second loading port 24 and between the first discharge port 43 and the second discharge port 44.

The runner 5 includes running wheels 7, a driving motor (not shown), and an encoder (not shown). The running wheels 7 are disposed in contact with the rail 6. The encoder detects the number of rotations of the running wheel 7, and outputs the detection result to an on-vehicle controller (not shown) mounted in the transferor (overhead transport vehicle) 50. The on-vehicle controller controls the driving motor based on the detection result of the encoder and controls the speed of the transferor 50 and a stop position thereof. A support shaft 9 extending downward from the runner 5 is mounted to the transferor (overhead transport vehicle) 50. The transfer mechanism 3 is mounted at a lower portion of the support shaft 9. The driving method for the transferor (overhead transport vehicle) 50 is not particularly limited.

The transfer mechanism 3 includes an article holder 53 that holds an article M, a lifting driver 54 that lifts and lowers the article holder 53 in the vertical direction, and a lateral extender 51 that moves the lifting driver 54. The article holder 53 grips a flange Mg of the article M to hold the article M while hooking the article M. For example, the article holder 53 is a chuck including a claw 53a capable of moving in the horizontal direction, and causes the claw 53a to enter below the flange Mg of the article M and raises the article holder 53, thus hooking and holding the article M. The article holder 53 is connected to the suspender 53b such as a wire and a belt.

For example, the lifting driver 54 is a hoist, which feeds the suspender 53b to lower the article holder 53 and winds the suspender 53b to raise the article holder 53. The lifting driver 54 is controlled by an on-vehicle controller and lowers or raises the article holder 53 at a predetermined speed such that the article holder 53 is moved to a target height.

The lateral extender 51 has a Y direction guide and a Y direction driver such as an electric motor (not shown) provided in the transfer mechanism 3, and a movable plate disposed to overlap in the Z direction. The lateral extender 51 is controlled by the on-vehicle controller such that the movable plate is moved in the +Y direction or the −Y direction by the Y direction driver, and the article holder 53 and the lifting driver 54 are moved from a storage position to a protruding position in the +Y direction or the −Y direction. A turning portion 52 is provided to the lifting driver 54. The turning portion 52 uses a turning driver (not shown) to rotate the article holder 53 and the lifting driver 54 about the axis in the vertical direction (Z direction). With this configuration, the article M held by the article holder 53 can be rotated about the axis in the vertical direction. The transferor 50 is not necessarily required to include the turning portion 52.

As illustrated in FIG. 4, the transferor 50 can transfer an article M placed on the first loading port 23 to the second loading port 24 and transfer an article M placed on the second discharge port 44 to the first discharge port 43. As illustrated in FIG. 5, the transferor 50 can move in the +X direction or the −X direction while the runner 5 travels along the rail 6. When the transferor 50 moves in the X direction, the transferor 50 can correspond to any of positions P1 to P4 of the first loading ports or the first discharge ports 43. The operation of the transferor 50 is described later.

The controller 60 comprehensively controls the operation of the floor-to-floor transport system 100. The controller 60 transmits an operation command to the transferor 50, and an on-vehicle controller for the transferor 50 that has received the operation command controls the operations of the runner 5, the lateral extender 51, the article holder 53, and the lifting driver 54. The controller 60 can dispose the transferor 50 at positions P1 and P2 between the first loading port 23 and the second loading port 24 and positions P3 and P4 between the first discharge port 43 and the fourth discharge port 44.

As illustrated in FIG. 3, the floor-to-floor transport system 100 is connected to the overhead transport vehicle system 80. The overhead transport vehicle system 80 includes a plurality of overhead transport vehicles 81 that can travel on the rail 82 and transport an article M within the same floor (in the present preferred embodiment, second floor F2) in the building. For example, each of the overhead transport vehicles 81 has the same configuration as that of the transferor 50 illustrated in FIG. 4, and moves along the rail 82 while holding the article M. The rail 82 has the same configuration as that of the rail 6 illustrated in FIG. 4 and FIG. 5. The rail 6 in the above-mentioned transferor 50 branches and merges from the rail 82 in the overhead transport vehicle system 80. A portion of the rail 82 is disposed immediately above or substantially immediately above the transport ports 26 and 46. Thus, when the overhead transport vehicle 81 is stopped immediately above any of the transport ports 26 and 46, the overhead transport vehicle 81 can receive an article M placed on the transport ports 26 or 46, and transport the article M to a desired location within the same floor. The transferor 50 and the overhead transport vehicle 81 can transfer from the rail 82 to the rail 6 or from the rail 6 to the rail 82.

Figure 6A:
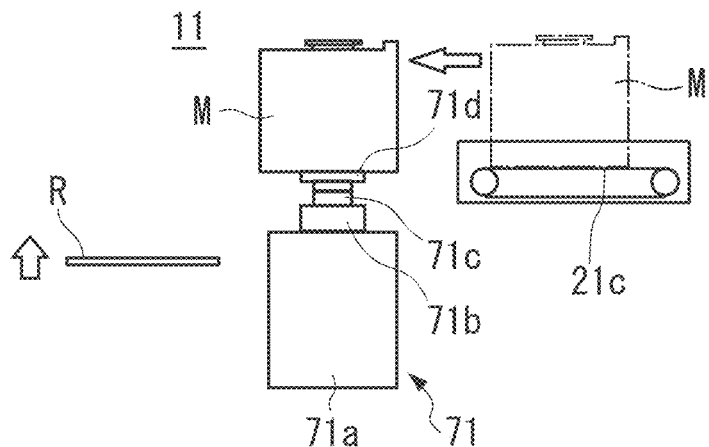
FIGS. 6A to 6C are diagrams illustrating an example of operation to load an article from a first loading opening to a vertical transporter.
Figure 6B:
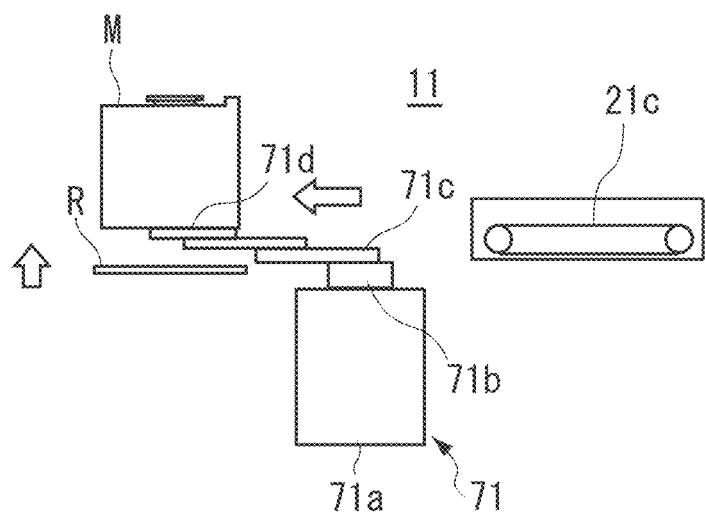
Figure 6C:
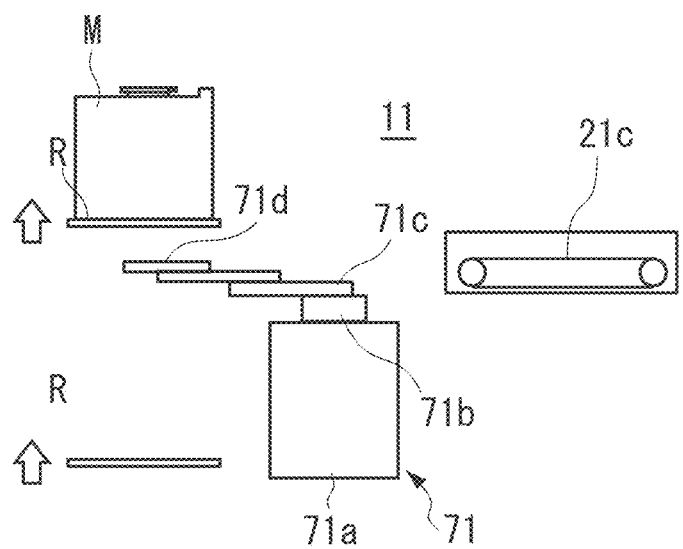

FIGS. 6A to 6C are diagrams illustrating an example of operation to load an article M from the first loading opening 11 to the vertical transporter V. As illustrated in FIGS. 6A to 6C, the loader 71 includes a base 71a, a lifter 71b, an extender 71c, and an article support 71d. The lifter 71b lifts and lowers in the Z direction with respect to the base 71a. The extender 71c elongates and contracts in the horizontal direction. The article support 71d supports the bottom of the article M.

Figure 7A:
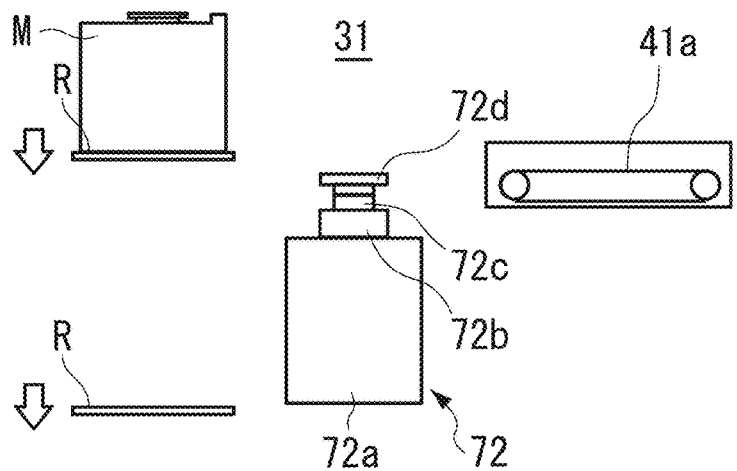
FIGS. 7A to 7C are diagrams illustrating an example of operation to unload an article through the first unloading opening.
Figure 7B:
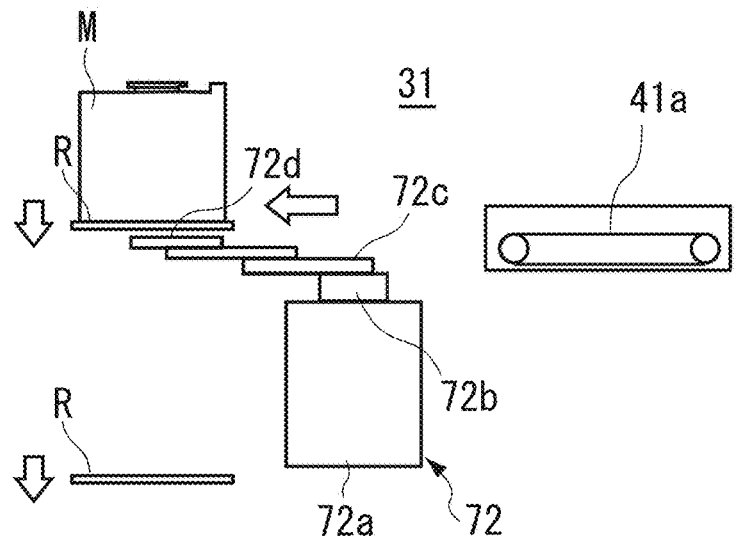
Figure 7C:
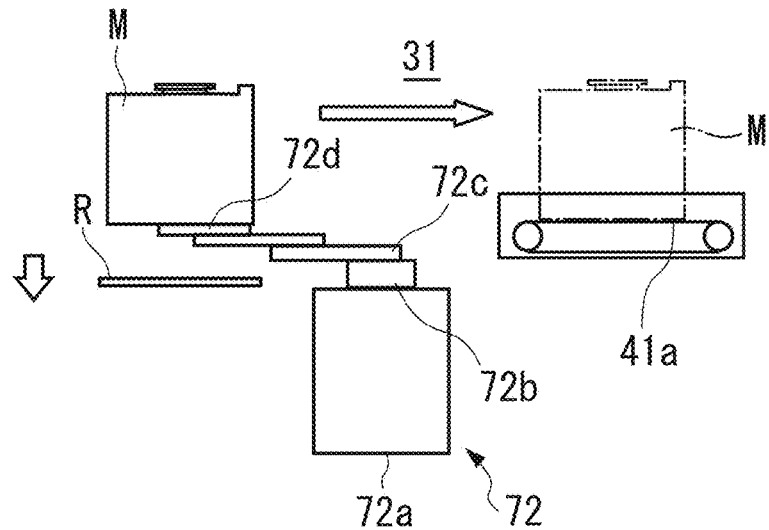
Figure 8A:
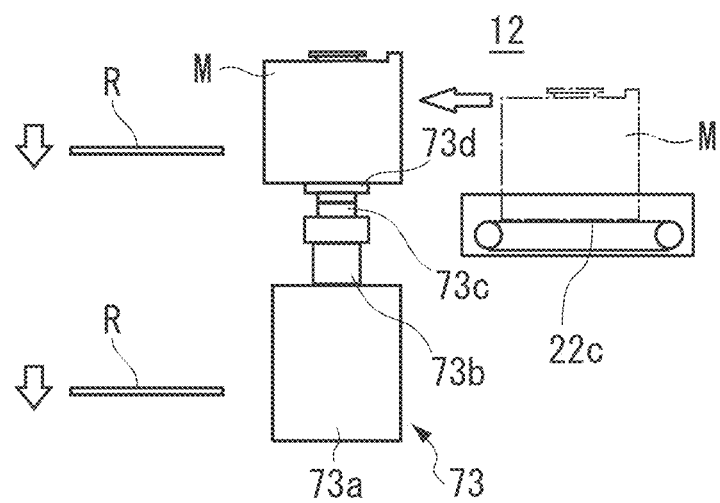
FIGS. 8A to 8C are diagrams illustrating an example of operation to load an article from a second loading opening to the vertical transporter.
Figure 8B:
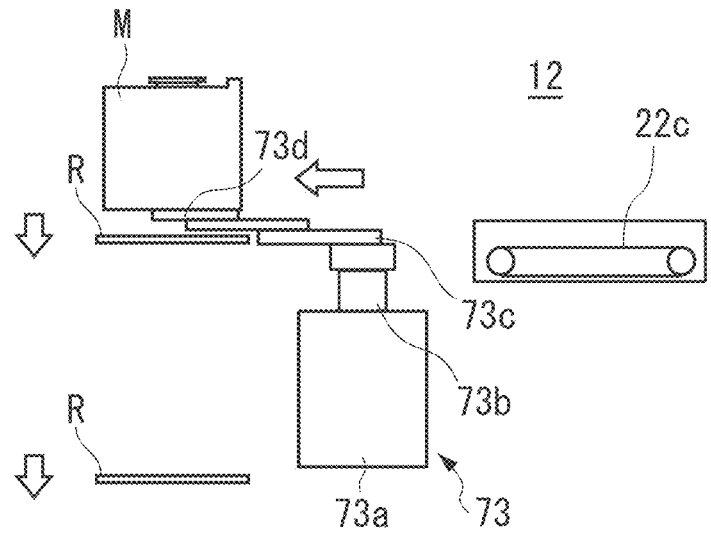
Figure 8C:
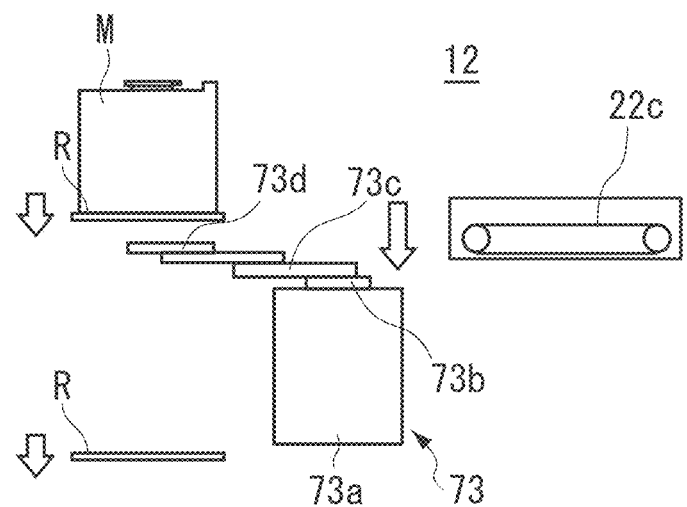
Figure 9A:
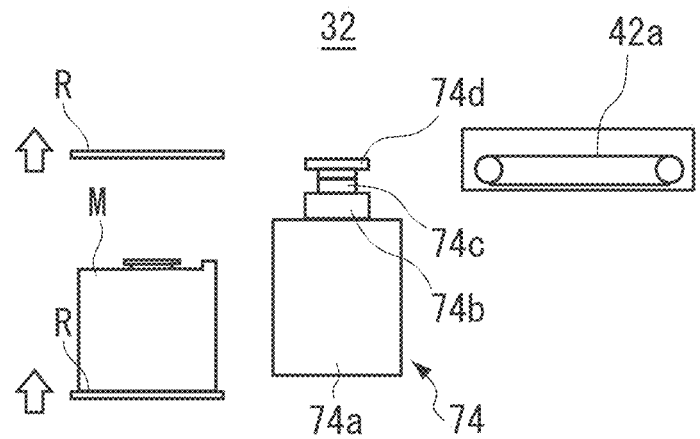
FIGS. 9A to 9C are diagrams illustrating an example of operation to unloaded an article through the second unloading opening.
Figure 9B:
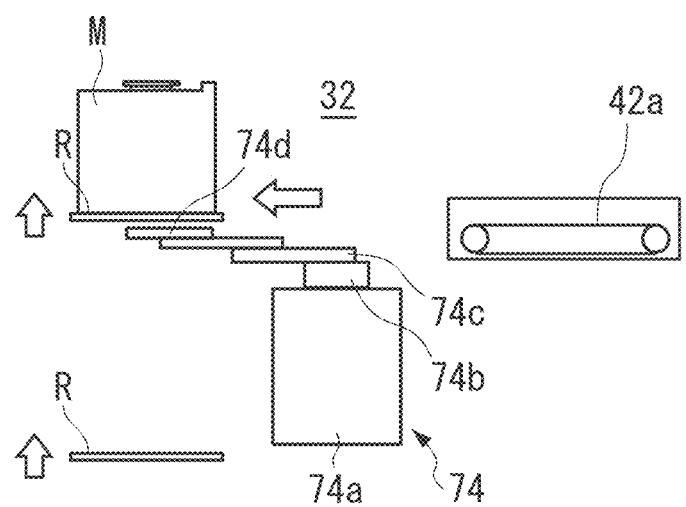
Figure 9C:
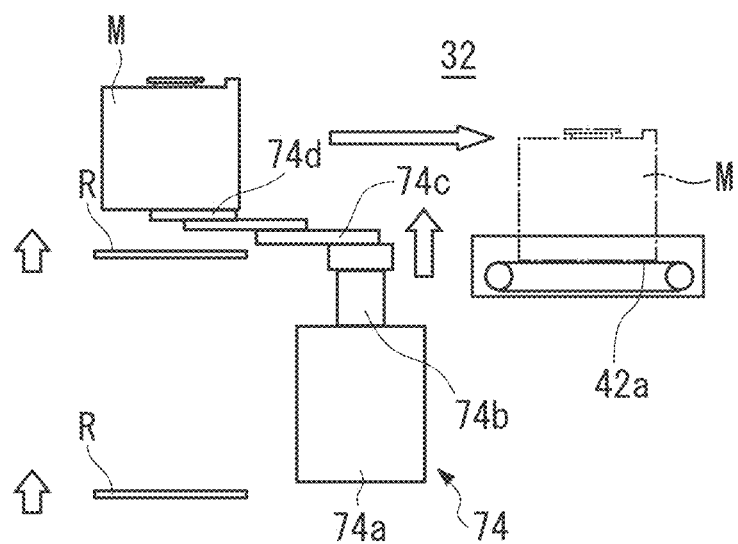

FIGS. 7A to 7C are diagrams illustrating an example of operation to unload an article M through the first unloading opening 31. As illustrated in FIGS. 7A to 7C, the unloader 72 includes a base 72a, a lifter 72b, an extender 72c, and an article support 72d. Configurations of the portions in the unloader 72 are the same as those in the above-mentioned loader 71, and hence descriptions thereof are omitted. FIGS. 8A to 8C are diagrams illustrating an example of operation to load an article M from the second loading opening 12 to the vertical transporter. As illustrated in FIGS. 8A to 8C, the loader 73 includes a base 73a, a lifter 73b, an extender 73c, and an article support 73d. Configurations of the portions in the loader 73 are the same as those in the above-mentioned loader 71, and hence descriptions thereof are omitted. FIGS. 9A to 9C are diagrams illustrating an example of operation to unload an article M through the second unloading opening 32. As illustrated in FIGS. 9A to 9C, the unloader 74 includes a base 74a, a lifter 74b, an extender 74c, and an article support 74d. Configurations of the portions in the unloader 74 are the same as those in the above-mentioned loader 71, and hence descriptions thereof are omitted. The operations of the loaders 71 and 73 and the unloaders 72 and 74 are described later.

Figure 10:
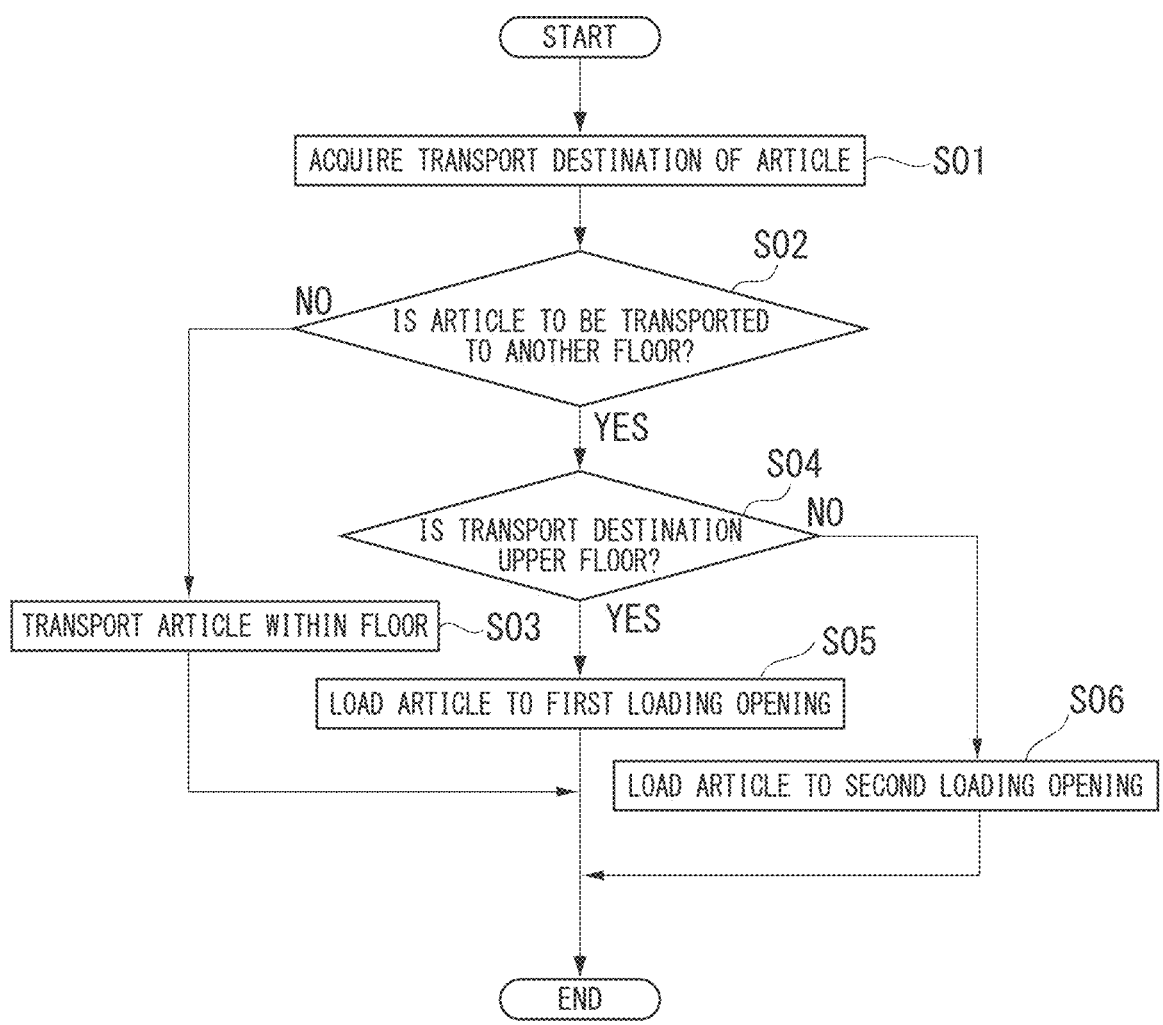
FIG. 10 is a flowchart illustrating an example of a floor-to-floor transport method according to a preferred embodiment of the present invention.

Next, the operation of the floor-to-floor transport system 100 configured as described above is described. FIG. 10 is a flowchart illustrating an example of a floor-to-floor transport method according to a preferred embodiment of the present invention. For description with reference to the flowchart in FIG. 10, the contents in FIG. 1 to FIGS. 9A to 9C are referred to as appropriate. As illustrated in FIG. 10, in the case where an article M is transported by the loading transport line 20 from the outside of a building, the floor-to-floor transport system 100 acquires a transport destination of the article M (Step S01). In the loading transport line 20, the detector 25 (see FIG. 1) detects a transport destination of the article M and transmits the detection result to the controller 60. The controller 60 identifies the transport destination of the article M based on the detection result transmitted from the detector 25 in the loading transport line 20. The controller 60 controls the loading transport line 20 and the transferor 50 in accordance with the transport destination of the article M.

Subsequently, the controller 60 determines whether to transport the article M to another floor (Step S02). The article M has been carried in the second floor F2 by the loading transport line 20 (see FIG. 1 and FIG. 2). When the article M is not transported to another floor (NO at Step S02; when the article M is transported at the second floor F2), the article M is transported within the floor (Step S03). At Step S03, the article M is transported from the external connector 21a to the transport ports 26 through the floor transporter 21d (see FIG. 3). The article M in the transport ports 26 is received by the overhead transport vehicle 81 and transported to a desired location in the second floor F2. In the case of transporting the article M to another floor (YES at Step S02), the controller 60 determines whether the transport destination of the article M is an upper floor (Step S04). When the transport destination of the article M is an upper floor (for example, third floor F3) (YES at Step S04), the controller 60 instructs to load the article M from the first loading opening 11 connected to the upward path Va in the vertical transporter V (Step S05). When the transport destination of the article M is a lower floor (for example, first floor F1) (NO at Step S04), the controller 60 instructs to load the article M from the second loading opening 12 connected to the downward path Vb in the vertical transporter V (Step S06).

In the case of loading the article M from the first loading opening 11, the controller 60 instructs to transport the article M without using the transferor 50. In this case, the transferor 50 stands by at a predetermined position or is performing another work. In the loading main line 21 in the loading transport line 20, the article M is transported to the first loading opening 11 through the external connector 21a, the linear transporter 21b, and the loading transporter 21c, and is loaded to the vertical transporter V from the first loading opening 11.

In the case of loading the article M from the second loading opening 12, the article M is placed on one of two first loading ports 23 through the external connector 21a and the linear transporter 21b in the loading main line 21. For example, the controller 60 instructs to place the article M on a free port of the two first loading ports 23. For example, when articles M have been already placed on both of the two first loading ports 23, the controller 60 may instruct to stop the transport of an article M in front of the first loading port 23 in the linear transporter 21b such that the article M stands by.

The controller 60 instructs the transferor 50 to transfer the article M placed on the first loading port 23 to one of the second loading ports 24. In this case, as illustrated in FIG. 5, the controller 60 instructs the transferor 50 to move to a position (position P1 or position P2) on the X direction so as to correspond to the first loading port 23 in which the article M is placed. In the following, the case where the article M is transported to the first loading port 23 on the −X side is described as an example, but the same descriptions can be applied to the case where the article M is transported to the first loading port 23 on the +X side.

When the article M is placed on the first loading port 23 on the −X side by the loading main line 21, the controller 60 instructs the transferor 50 to be located at the position P1. Subsequently, as illustrated in FIG. 4, the transferor 50 controls the lateral extender 51 to protrude to the −Y side such that the article holder 53 is disposed immediately above the article M. Subsequently, the transferor 50 controls the lifting driver 54 to lower the article holder 53 in the −Z direction to hold the article M. After the article M is held by the article holder 53, the transferor 50 controls the lifting driver 54 to raise the article holder 53 in the +Z direction.

After the article holder 53 is raised, the transferor 50 controls the lateral extender 51 to protrude to the +Y side with the article M held by the article holder 53, so that the article M is disposed immediately above the second loading port 24 (see FIG. 5) on the −X side. Subsequently, the transferor 50 controls the lifting driver 54 to lower the article holder 53 in the −Z direction such that the article M is placed on the second loading port 24. After the article M is placed on the second loading port 24, the transferor 50 controls the lifting driver 54 to raise the article holder 53 and controls the lateral extender 51 to return the article holder 53 to its original position. The article M placed on the second loading port 24 is transported to the second loading opening 12 through the linear transporter 22b and the loading transporter 22c in the loading connection line 22, and is loaded to the vertical transporter V from the second loading opening 12.

On the other hand, when the article M has been unloaded from the vertical transporter V through the first unloading opening 31, the controller 60 instructs to transport the article M without using the transferor 50. In this case, the transferor 50 stands by at a predetermined position or performs another work. In the discharge main line 41 in the discharge transport line 40, the article M is discharged to the outside of the building through the discharge transporter 41a, the linear transporter 41b, and the external connector 41c.

When the article M has been unloaded from the vertical transporter V through the second unloading opening 32, the article M is transported to one of the two first discharge ports 43 through the discharge transporter 42a and the linear transporter 42b in the discharge connection line 42. For example, the controller 60 instructs to place the article M on a free port of the two first discharge ports 43. For example, when articles M have been already placed on both of the two first discharge ports 43, the controller 60 may instruct to stop the transport of an article M in front of the first discharge port 43 in the linear transporter 42b such that the article M stands by.

The controller 60 instructs the transferor 50 to transfer the article M placed on the first discharge port 43 to one of the second discharge ports 44. In this case, as illustrated in FIG. 5, the controller 60 instructs the transferor 50 to move to a position (position P3 or position P4) on the X direction so as to correspond to the first discharge port 43 in which the article M is disposed. In the following, the case where the article M is transported to the first discharge port 43 on the −X side is described as an example, but the same description can be applied to the case where the article M is transported to the first discharge port 43 on the +X side.

When the article M is placed on the first discharge port on the −X side by the discharge connection line 42, the controller 60 instructs the transferor 50 to be located at the position P3. Subsequently, as illustrated in FIG. 4, the transferor 50 controls the lateral extender 51 to protrude to the −Y side such that the article holder 53 is disposed immediately above the article M. Subsequently, the transferor 50 controls the lifting driver 54 to lower the article holder 53 in the −Z direction such that the article M is held by the article holder 53. After the article M is held by the article holder 53, the transferor 50 controls the lifting driver 54 to raise the article holder 53 in the +Z direction.

After the article holder 53 is raised, the transferor 50 controls the lateral extender 51 to protrude to the +Y side with the article M held by the article holder 53, so that the article M is disposed immediately above the second discharge port 44 (see FIG. 5) on the −X side. Subsequently, the transferor 50 controls the lifting driver 54 to lower the article holder 53 in the −Z direction such that the article M is placed on the second discharge port 44. After the article M is placed on the second discharge port 44, the transferor 50 controls the lifting driver 54 to raise the article holder 53 and controls the lateral extender 51 to return the article holder 53 to its original position. The article M placed on the second discharge port 44 is discharged to the outside of the building through the linear transporter 41b and the external connector 41c in the discharge main line 41. In the case of transporting an article M to the same floor (in the present preferred embodiment, second floor F2), the article M is transported from the external connector 41c to the transport ports 46 through the floor transporter 41d (see FIG. 3). The article M in the transport ports 46 is received by the overhead transport vehicle 81 and transported to a desired location in the second floor F2.

Next, the operation to load an article M to the vertical transporter V and the operation to unload the article M from the vertical transporter V are described. First, the loading operation and the unloading operation for an article M at an upper place F2a of the second floor F2 are described. As illustrated in FIG. 6A, the loader 71 receives an article M that has been transported by the loading transporter 21c. Subsequently, when a rising rack R reaches a predetermined position in the Z direction, as illustrated in FIG. 6B, the loader 71 elongates the extender 71c toward the inside of the first loading opening 11. The timing of elongating the extender 71c is after a rack R disposed above a rack R on which an article M is to be placed passes on the side of the article support 71d and before the target rack R reaches a height position of the article support 71d.

By elongating the extender 71c, the article support 71d is disposed above and next to the rack R. Subsequently, as illustrated in FIG. 6C, the rack R further rises along the upward path Va and takes up and receives the article M placed on the article support 71d. The article support 71d passes through a notch Ra (see FIG. 1) of the rack R. In this manner, the article M is loaded by the loader 71 from the loading transporter 21c (loading transport line 20) to the rack R in the upward path Va in the vertical transporter V. By contracting the extender 71c, the article support 71d retreats from the upward path Vb in the vertical transporter V.

In the case of unloading the article M through the first unloading opening 31, as illustrated in FIG. 7A, the unloader 72 stands by until a rack R on which an article M to be unloaded approaches. Subsequently, as illustrated in FIG. 7B, when the rack R having the article M placed thereon approaches, the unloader elongates the extender 72c toward the inside of the first unloading opening 31. The timing of elongating the extender 72c is after a rack R disposed below a rack R having an article M to be unloaded placed thereon passes on the side of the article support 72d and before the rack R having the target article M placed thereon reaches a height position of the article support 72d.

By elongating the extender 72c, the article support 72d is disposed below the rack R. Subsequently, as illustrated in FIG. 7C, the rack R lowers, and the article M is transferred to the article support 72d from the rack R lowering along the downward path Vb. The notch Ra (see FIG. 1) of the rack R passes through the article support 72d. By contracting the extender 72c, the article support 72d retreats from the downward path Vb in the vertical transporter V and places the article M on the discharge transporter 41a. In this manner, the article M is unloaded by the unloader 72 to the discharge transporter 41a from the rack R in the downward path Vb in the vertical transporter V.

Next, the loading operation and the unloading operation for an article M at a lower place F2b of the second floor F2 are described. As illustrated in FIG. 8A, the loader 73 receives an article M that has been transported from the loading transporter 22c. Subsequently, the loader 73 stands by until a rack R lowering in the downward path Vb passes on the side of the article support 73d in the state in which the article support 73d is raised by the lifter 73b. As illustrated in FIG. 8B, the loader 73 elongates extender 73c toward the inside of the second loading opening 12 at a timing at which the rack R on which the article M is to be placed passes on the side of the article support 73d. Through the operation, the article support 73d is disposed above the rack R at a placement destination of the article M.

From this state, as illustrated in FIG. 8C, the loader 73 uses the lifter 73b to lower the article support 73d at a speed higher than a speed of the lowering rack R. Through this operation, the article support 73d passes below the notch Ra of the rack R, and the article M on the article support 73d is transferred to the rack R in the downward path Vb. The article support 73d that has moved below the rack R contracts the extender 73c to retreat from the downward path Vb in the vertical transporter V.

In the case of unloading an article M through the second unloading opening 32, as illustrated in FIG. 9A, the unloader 74 stands by until a rack R having an article M to be unloaded placed thereon passes on the side of the article support 74d in the upward path Va while the article support 74d is lowered by the lifter 74b. As illustrated in FIG. 9B, the unloader 74 elongates the extender 74c toward the inside of the second unloading opening 32 at a timing at which the target rack R passes on the side of the article support 74d. Through this operation, the article support 74d is disposed below the rack R.

From this state, as illustrated in FIG. 9C, the unloader 74 raises the lifter 74b at a speed higher than a speed of the rising rack R. Through this operation, the article support 74d passes above the notch Ra of the rack R and takes up and receives the article M placed on the rack R. The article support 74d that has moved above the rack R contracts the extender 74c to retreat from the upward path Va in the vertical transporter V and places the article M on the discharge transporter 42a. In this manner, the article M is unloaded from the rack R in the upward path Va in the vertical transporter V by the unloader 74 to the discharge transporter 42a.

As described above, in the floor-to-floor transport system 100 according to the present preferred embodiment, an article M to be transported to an upper floor is loaded to the first loading opening 11 in the upward path Va and unloaded through the second unloading opening 31 in the upward path Va, and an article M to be transported to a lower floor is loaded to the second loading opening 12 in the downward path Vb and unloaded through the first unloading opening 31 in the downward path Vb. As a result, the article M is transported in the shortest route without being circulated or transported by the vertical transporter V, and hence the time required for floor-to-floor transport of the article M can be reduced to suppress the reduction in production efficiency.

Figure 11:
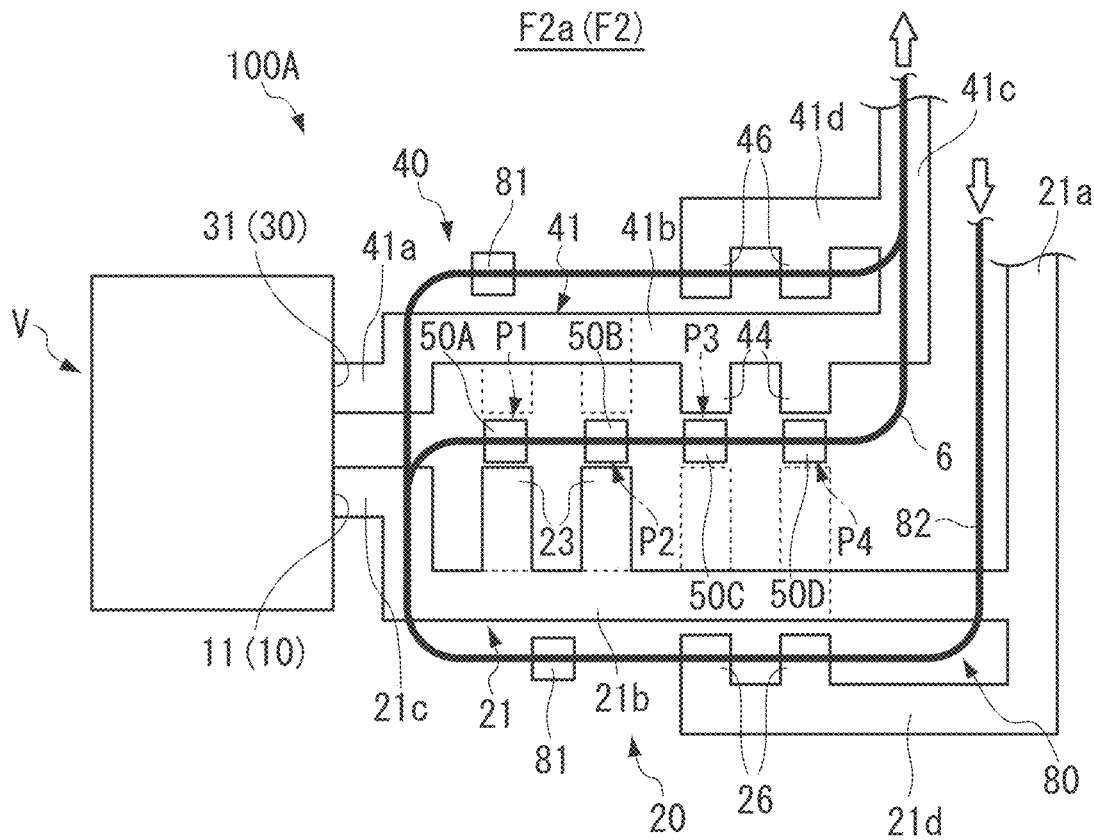
FIG. 11 is a plan view of another example of a floor-to-floor transport system according to a preferred embodiment of the present invention as seen from the above.
Figure 11:
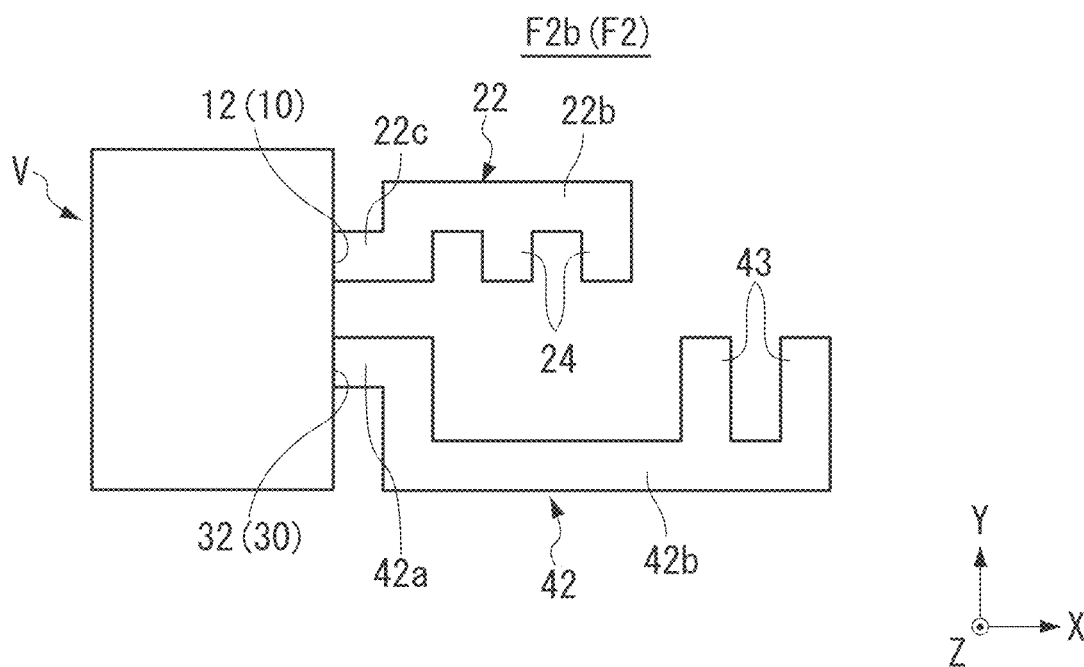

In the above-mentioned preferred embodiment, the configuration in which the transferor (overhead transport vehicle) 50 is movable in the X direction has been described as an example, but the preferred embodiment is not limited to this configuration. FIG. 11 is a plan view illustrating another example of the floor-to-floor transport system according to another preferred embodiment of the present invention. In FIG. 11, the configurations of the upper place F2a and the lower place F2b in the second floor F2 are separately illustrated. In the following description, the same or corresponding components as those in the above-mentioned preferred embodiments are denoted by the same reference symbols, and descriptions thereof are omitted or simplified.

In a floor-to-floor transport system 100A illustrated in FIG. 11, transferors 50A, 50B, 50C, and 50D are disposed at a position P1 between a first loading port 23 on the −X side and a second loading port 24 on the −X, a position P2 between a first loading port 23 on the +X side and a second loading port 24 on the +X side, a position P3 between a first discharge port 43 on the −X side and a second discharge port 44 on the −X side, and a position P4 between a first discharge port 43 on the +X side and a first discharge port 44 on the +X side, respectively.

In this manner, the transferors 50A to 50D are disposed at the positions P1 to P4, and hence the transfer of an article from the first loading port 23 to the second loading port 24 and the transfer of an article from the first discharge port 43 to the second discharge port 44 are performed by the individual transferor 50A and the like, and hence the article M can be efficiently transferred, and quick response can be made even when the number of articles M to be transferred is large.

Figure 12:
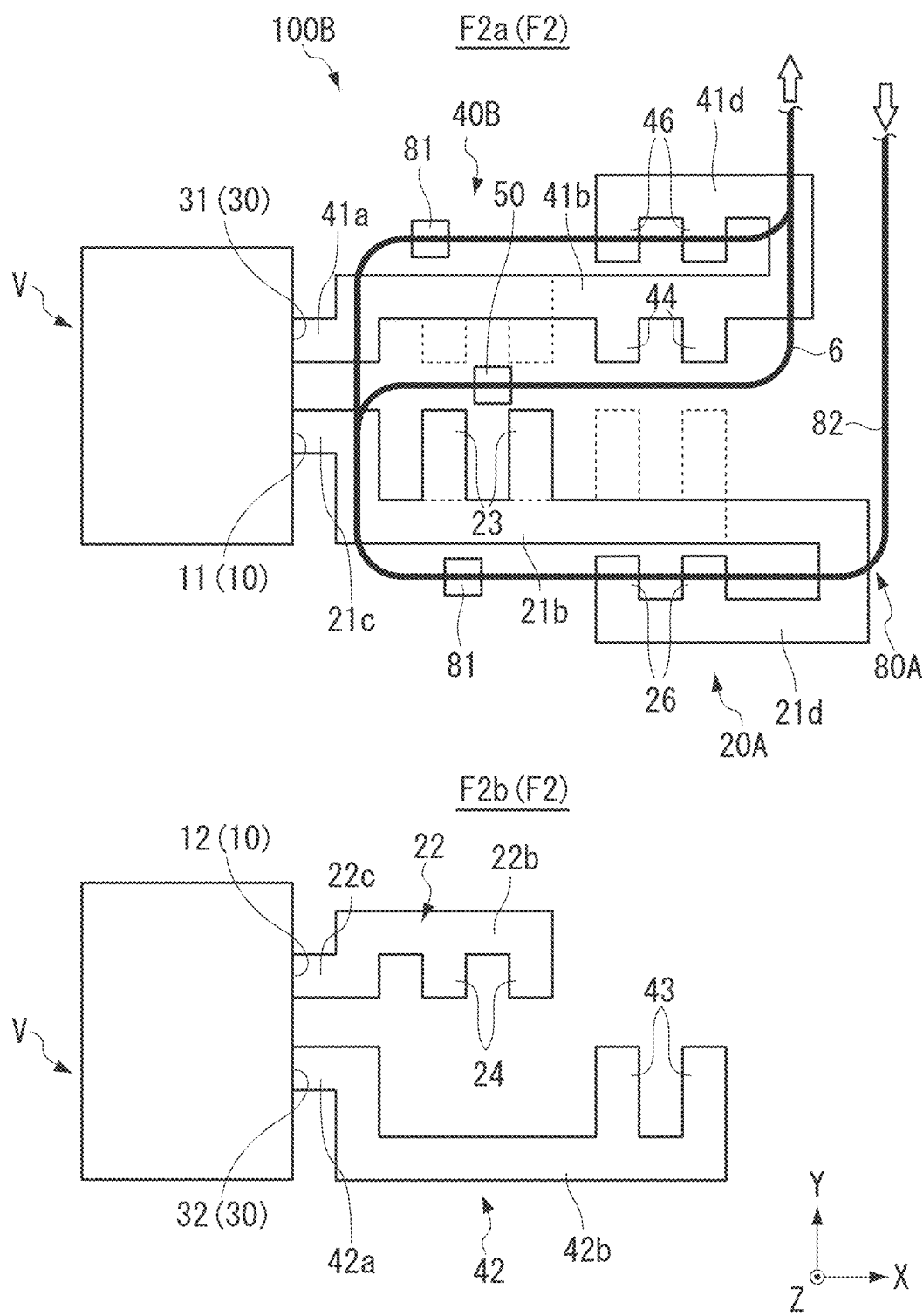
FIG. 12 is a plan view of another example of a floor-to-floor transport system according to a preferred embodiment of the present invention as seen from the above.

In the above-mentioned preferred embodiment, the configuration in which the loading transport line 20 and the discharge transport line 40 including conveyors are used to carry in an article M from the outside of a building and discharge the article M to the outside of the building has been described as an example, but the preferred embodiment is not limited thereto. FIG. 12 is a plan view illustrating another example of the floor-to-floor transport system according to the present preferred embodiment. In FIG. 12, the configurations of the upper place F2a and the lower place F2b in the second floor F2 are separately illustrated. In the following description, the same or corresponding components as those in the above-mentioned preferred embodiments are denoted by the same reference symbols, and descriptions thereof are omitted or simplified. In a floor-to-floor transport system 100B illustrated in FIG. 12, an overhead transport vehicle system 80A carries in an article M from the outside of a building and discharges the article M to the outside of the building. The overhead transport vehicle system 80A includes an overhead transport vehicle 81 and a rail 82 similarly to the overhead transport vehicle system 80.

The rail 82 extends from the outside of the building. The rail 82 is laid continuously from a region above the linear transporter 21b in the loading transport line 20A to a region above the linear transporter 41b in the discharge transport line 40B and extends toward the outside of the building. The rail 82 is connected to the rail 6 in the transferor 50 similarly to the above-mentioned preferred embodiment. The rail 82 is laid over the inside and outside of the building, and similarly to the above-mentioned overhead transport vehicle system 80, the rail 82 is laid such that the article M can be transported by the overhead transport vehicle 81 within the same floor.

In the floor-to-floor transport system 100B, in the case where an article M that has been transported from the outside of a building by the overhead transport vehicle 81 is transported to the first loading opening 11, the article M is placed on the transport ports 26 in the loading transport line 20A by the overhead transport vehicle 81. Through this operation, the article M is transported to the first loading opening 11 by the linear transporter 21b and the loading transporter 21c. In the case of transporting an article M to the second loading opening 12, the article M is placed on the transport ports 26 in the loading transport line 20A by the overhead transport vehicle 81. The article M is transported from the linear transporter 21b to the first loading port 23. The article M placed on the first loading port 23 is transferred to the second loading port 24 in the loading connection line 22 by the transferor 50, and transported to the second loading opening 12 by the linear transporter 21b and the loading transporter 22c in the first loading port 23. In the case where an article M that has been transported from the outside of a building is transferred to the same floor (in the present preferred embodiment, second floor F2), the overhead transport vehicle 81 can directly transport the article M to a desired location without transferring the article M to the floor-to-floor transport system 100B.

The article M unloaded through the first unloading opening 31 in the vertical transporter V is placed on the transport ports 46 through the discharge transporter 41a, the linear transporter 41b, and the floor transporter 41d in the discharge transport line 40B. The article M placed on the transport ports is received by the overhead transport vehicle 81 and is discharged to the outside of the building or transported to a desired location on the same floor (in the present preferred embodiment, second floor F2). The article M unloaded through the second unloading opening 32 in the vertical transporter V is placed on the first discharge port 43 by the discharge transporter 42a and the linear transporter 42b. The article M placed on the first discharge port 43 is transferred to the second discharge port 44 in the discharge transport line 40B by the transferor 50. The article M transferred to the second discharge port 44 is placed on the transport ports 46 through the linear transporter 41b and the floor transporter 41d and received by the overhead transport vehicle 81, and similarly to the above, discharged to the outside of a building or transported to a desired location on the same floor.

In this manner, in the floor-to-floor transport system 100B, the overhead transport vehicle system 80A carries in an article M from the outside of a building and discharges the article M to the outside of the building. Thus, for example, by extending a rail in an existing overhead transport vehicle system to a floor to the outside of a building and transporting the article M between the outside of the building and the floor-to-floor transport system 100B, the need of installing a conveyor over a long distance as in the above-mentioned preferred embodiment can be omitted.

While preferred embodiments have been described above, the present invention is not limited to the above description and can be variously changed within the range not departing from the gist of the present invention. In the above-mentioned preferred embodiments, an overhead transport vehicle is used as the transferor 50, but the preferred embodiments are not limited to this configuration. For example, a dedicated transferor to transfer an article M may be installed instead of the overhead transport vehicle. To the extent permitted by the law, the entire contents of Japanese Patent Application No. 2017-111474 and all documents cited herein are hereby incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A floor-to-floor transport system that transports an article between different floors by using an upward path and a downward path in a vertical transporter that revolves in one direction, the floor-to-floor transport system comprising, on at least one floor:
    a loading transport line that transports to the vertical transporter an article to be transported to another floor;
    a first loading opening through which the article is loaded into the upward path in the vertical transporter;
    a second loading opening through which the article is loaded into the downward path in the vertical transporter;
    a transferor that selectively transfers to the first loading opening or the second loading opening an article transported by the loading transport line; and
    a controller that controls the transferor depending on a destination of the article.

2. The floor-to-floor transport system according to claim 1, wherein the loading transport line includes:
    a loading main line connected to one of the first loading opening and the second loading opening;
    a first loading port that transfers to the transferor an article to be transported to another of the first loading opening and the second loading opening;
    a second loading port on which an article transferred from the first loading port by the transferor is placed; and
    a loading connection line that transports to the other of the first loading opening and the second loading opening an article from the second loading port.

3. The floor-to-floor transport system according to claim 2, wherein
    one or both of the first loading port and the second loading port are provided in plurality; and
    the transferor is capable of moving between a plurality of the first loading ports or between a plurality of the second loading ports.

4. The floor-to-floor transport system according to claim 2, wherein
    one or both of the first loading port and the second loading port are provided in plurality; and the transferor is provided for each of a plurality of the first loading ports or each of a plurality of the second loading ports.

5. The floor-to-floor transport system according to claim 1, wherein the transferor is an overhead transport vehicle that moves along a rail installed on a ceiling or adjacent to a ceiling and includes a transferor capable of transferring an article.

6. A floor-to-floor transport system that transports an article between different floors by using an upward path and a downward path in a vertical transporter that revolves in one direction, the floor-to-floor transport system comprising, on at least one floor:
a discharge transport line that transports an article that has been transported from another floor and been unloaded from the vertical transporter;
a first unloading opening through which an article is unloaded from the downward path in the vertical transporter;
a second unloading opening through which an article is unloaded from the upward path in the vertical transporter;
a transferor that transfers to the discharge transport line the article unloaded through the first unloading opening or the second unloading opening; and
a controller that controls the transferor.

7. The floor-to-floor transport system according to claim 6, wherein the discharge transport line includes:
a discharge main line connected to one of the first unloading opening and the second unloading opening;
a discharge connection line that transports an article that has been unloaded through the first unloading opening or the second unloading opening;
a first discharge port that transfers to the transferor an article that has been transported by the discharge connection line; and
a second discharge port on which an article transferred from the first discharge port by the transferor is placed, and that sends the article to the discharge transport line.

8. The floor-to-floor transport system according to claim 7, wherein
one or both of the first discharge port and the second discharge port are provided in plurality; and
the transferor is capable of moving between a plurality of the first discharge ports or between a plurality of the second discharge ports.

9. The floor-to-floor transport system according to claim 7, wherein
one or both of the first discharge port and the second discharge port are provided in plurality; and
the transferor is provided for each of a plurality of the first discharge ports or each of a plurality of the second discharge ports.

10. A floor-to-floor transport system that transports an article between different floors by using an upward path and a downward path in a vertical transporter that revolves in one direction, the floor-to-floor transport system comprising, on at least one floor:
a loading transport line that transports to the vertical transporter an article to be transported to another floor;
a first loading opening through which the article is loaded into the upward path in the vertical transporter;
a second loading opening through which the article is loaded into the downward path in the vertical transporter;
a discharge transport line that transports an article that has been transported from another floor and been unloaded from the vertical transporter;
a first unloading opening through which an article is unloaded from the downward path in the vertical transporter;
a second unloading opening through which an article is unloaded from the upward path in the vertical transporter;
a transferor that selectively transfers to the first loading opening or the second loading opening an article transported by the loading transport line and transfers to the discharge transport line an article unloaded through the first unloading opening or the second unloading opening; and
a controller that controls the transferor.

11. A floor-to-floor transport method to transport an article between different floors by using an upward path and a downward path in a vertical transporter that revolves in one direction, the floor-to-floor transport method comprising:
acquiring, on at least one floor, a transport destination of an article that has been transported; and
determining, when transporting the article to another floor, based on the acquired transport destination, whether to load the article into a first loading opening provided in the upward path in the vertical transporter or load the article into a second loading opening provided in the downward path in the vertical transporter.

* * * * *